US006511792B2

(12) United States Patent
Fujino et al.

(10) Patent No.: US 6,511,792 B2
(45) Date of Patent: Jan. 28, 2003

(54) DEVELOPING PROCESS, PROCESS FOR FORMING PATTERN AND PROCESS FOR PREPARING SEMICONDUCTOR DEVICE USING SAME

(75) Inventors: Atsuko Fujino, Tokyo (JP); Teruhiko Kumada, Tokyo (JP); Atsushi Oshida, Tokyo (JP); Koji Tange, Tokyo (JP); Hitoshi Fukuma, Itami (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/793,578

(22) Filed: Feb. 27, 2001

(65) Prior Publication Data

US 2001/0018166 A1 Aug. 30, 2001

(30) Foreign Application Priority Data

Feb. 28, 2000 (JP) ...................................... 2000-050768

(51) Int. Cl.[7] ............................. G03F 7/42; G03F 7/26
(52) U.S. Cl. ....................................... 430/311; 430/331
(58) Field of Search ................................ 430/311, 331, 430/296, 270.1, 942

(56) References Cited

U.S. PATENT DOCUMENTS 4,454,222 A * 6/1984 Tada .......................... 430/326
5,403,699 A 4/1995 Takechi et al. ............. 430/296
6,221,568 B1 4/2001 Angelopoulos et al. ..... 430/331

FOREIGN PATENT DOCUMENTS

JP 2000-267297 9/2000
JP 2001-215731 * 8/2001

OTHER PUBLICATIONS

H. Namatsu, et al., Microelectronic Engineering, vol. 27, No. 1, pp. 71–74, "10–NM Silicon Lines Fabricated in (110)Silicon," 1995.

* cited by examiner

*Primary Examiner*—Kathleen Duda
(74) *Attorney, Agent, or Firm*—Oblon, Spivak, McClelland, Maier & Neustadt, P.C.

(57) ABSTRACT

By using a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms for developing a positive-type radiation resist containing a copolymer of an α-methyl styrene compound and an α-chloroacrylate ester compound as a base resin, there is provided a developing process and a process for forming a pattern (according to GHOST method in particular) which are used for preparing an excellent resist pattern profile, a process for preparing a photomask and a process for preparing a semiconductor device.

14 Claims, No Drawings

DEVELOPING PROCESS, PROCESS FOR FORMING PATTERN AND PROCESS FOR PREPARING SEMICONDUCTOR DEVICE USING SAME

BACKGROUND OF THE INVENTION

The present invention relates to a process for developing a positive-type radiation resist, a process for forming a pattern using a positive-type radiation resist (according to GHOST method, in particular), a process for forming a pattern suitable for preparing a photomask and a process for preparing a semiconductor device in which a pattern is formed by using a positive-type radiation resist. Specifically, it relates to a developing process which are used for forming a pattern on a resist material such as a radio-sensitive resist; a process for forming a pattern, in particular, a process for forming a pattern of a photomask used for forming a micro-pattern of a semiconductor device such as ultra LSI; and a process for preparing a semiconductor device in order to form a micro-pattern of a semiconductor device such as ultra LSI.

In accordance with the increasing demand on the high integration of semiconductor devices, the micro-processing technology is developed. For a successful micro-pattern forming, exposure processes according to ultraviolet ray, X-ray or electron beam (EB) are being proposed. The micro-pattern forming requires a highly precise mask, the pattern of which is formed by using an EB resist. As a positive EB resist for a mask, a resist containing a copolymer of an α-methyl styrene compound and an α-chloroacrylate ester compound as a base resin is widely used.

A mixed solvent, trade name: ZED-500 available from Nippon Zeon Co. Ltd., comprising diethylketone and diethyl malonate as a developer is mainly used for developing resist. Since this developer is a mixture of the two organic solvents and evaporation amount of each solvent differs from each other during development, there arises a difference in development proceedings, and thus the solution had a defect in critical dimension (CD) uniformity. Also, since the solvents had high solubility against a low exposed area of the resist and resist thickness is largely reduced at the non-exposed area, there was a problem that a highly contrastive pattern is difficult to prepare. The contrast herein refers to normalized residual film thickness at the non-exposed area against exposure dose. The higher the contrast, the larger the resist thickness, and a resist pattern can be formed excellently.

SUMMARY OF THE INVENTION

The object of the present invention is to provide a developing process; a process for forming a pattern, wherein an excellent resist pattern can be formed uniformly on a substrate surface by using positive-type radiation resist containing a copolymer of an α-methyl styrene compound and an α-chloroacrylate ester compound as a base resin; a process for preparing a photomask; and a process for preparing a semiconductor device.

The present invention is based on the fact discovered by the inventors through intense study for solving the above problem, that a highly contrastive resist pattern can be obtained by using a developer consisting essentially of one particular organic solvent for developing positive-type radiation resist containing a copolymer of an α-methyl styrene compound and an α-chloroacrylate ester compound as a base resin.

Namely, the present invention relates to:

a developing process comprising using a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms for developing positive-type radiation resist containing a copolymer of an α-methyl styrene compound and an α-chloroacrylate ester compound as a base resin (the first invention);

a process for forming a pattern using a positive-type radiation resist containing a copolymer of an α-methyl styrene compound and an α-chloroacrylate ester compound as a base resin, wherein a developer consisting essentially of one organic solvent selected from the group consisting of a ketone having 3 to 8 carbon atoms, a carboxylate ester having 3 to 8 carbon atoms, which may have an alkoxyl group, and a dicarboxylate ester having 3 to 8 carbon atoms is used (the second invention); and a process for preparing a semiconductor device comprising a step for forming a resist film on a semiconductor substrate, a step for exposing the resist to be patterned, and a step for developing the resist after the exposure, wherein the resist is a positive-type radiation resist containing a copolymer of an α-methyl styrene compound and an α-chloroacrylate ester compound as a base resin is used, and wherein a developer consisting essentially of one organic solvent selected from the group consisting of a ketone having 3 to 8 carbon atoms, a carboxylate ester having 3 to 8 carbon atoms, which may have an alkoxyl group, and a dicarboxylate ester having 3 to 8 carbon atoms (the third invention).

Preferably, the developer consists essentially of one organic solvent selected from the group consisting of propyleneglycol monomethylether acetate, 2-pentanone and ethyl-3-ethoxypropionate in the first, second and third inventions, respectively.

The process of the second invention is preferably a process for forming a pattern according to GHOST method. Also, the second invention is suitable for forming a photomask pattern.

DETAILED DESCRIPTION

Embodiment 1

(Developing process)

The first embodiment (Embodiment 1) of the present invention relates to a process for developing a positive-type radiation resist containing a copolymer of an α-methyl styrene compound and an α-chloroacrylate ester compound as a base resin, wherein a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms is used.

The organic solvent having more carbon atoms than the above range has an extremely high solubility against a resist causing an increase of dissolution rate at non-exposed area, and therefore, a contrast tends to be decreased while a sensitivity is improved. An organic solvent having less carbon atoms than the above range has extremely low solubility against a resist causing a decrease of a sensitivity and making a development difficult, and therefore, a development tends to take much time.

As a ketone having 3 to 8 carbon atoms, a ketone having 4 to 6 carbon atoms is preferable. Examples thereof are acetone, methyl ethyl ketone, 2-pentanone, 3-methyl-2-butanone, 2-hexanone, 4-methyl-2-pentanone (MIBK), 2-heptanone, diethylketone, 3-hexanone, 3-heptanone, 4-heptanone, cyclohexanone and the like.

As a carboxylate ester having 3 to 8 carbon atoms, which may have an alkoxyl group, a carboxylate ester having 3 to 6 carbon atoms with no alkoxyl group and a carboxylate ester having 5 to 7 carbon atoms with an alkoxyl group are preferable. Examples thereof are methyl acetate, ethyl acetate, n-propyl acetate, butyl acetate, isoamyl acetate, methyl propionate, ethyl propionate, methyl butyrate, ethyl butyrate, ethyl-3-ethoxypropionate (EEP), propyleneglycol monomethylether acetate (PGMEA), methyl-3-methoxypropionate (MMP), propyleneglycol monoethylether acetate and the like.

As a dicarboxylate ester having 3 to 8 carbon atoms, a dicarboxylate ester having 4 to 8 carbon atoms is preferable. Examples thereof are diethyl oxalate, dimethyl malonate, diethyl malonate, dimethyl succinate, diethyl succinate and the like.

When mass production is considered, it is effective to use a developer consisting essentially of one organic solvent selected from the group consisting of PGMEA, 2-pentanone and EEP from the viewpoints of solubility characteristics, a sensitivity, the price of the solvent and the like.

As a positive-type radiation resist containing a copolymer of an α-methyl styrene compound and an α-chloroacrylate ester compound as a base resin, a positive-type radiation resist having a reaction system such as PMMA can be used. In other words, it is possible to use a positive-type radiation resist having a reaction system such that solubility against the developer is improved due to a changing molecular weight caused by disconnection of the polymer chain of the base resin after a radiation exposure (exposure), and accordingly a solubility difference between the exposed part and the non-exposed part turns out to be contrast on a pattern formed.

Generally, a positive-type radiation resist can contain, for example, a surfactant in addition to the base resin.

A surfactant or other elements, for example, can be added to a developer provided they are in a small amount. The addition brings about an effect on an improvement in a development.

As a base resin for a positive-type radiation resist, a copolymer of an α-methyl styrene compound and an α-chloroacrylate ester compound having an weight-average molecular weight of 10,000 to 1,000,000, preferably 50,000 to 400,000, more preferably 300,000 to 340,000 can be used. A low-molecular weight base resin has a high solubility to a developer and there may be an occasional decrease in a contrast of the pattern. Herein, the weight-average molecular weight refers to a value calculated as polystyrene according to a gel permeation chromatography in which tetrahydrofuran is used as an eluent.

It is preferable to use a copolymer of α-methylstyrene and methyl α-chloroacrylate as a copolymer of an α-methylstyrene compound and an α-chloroacrylate ester compound from the viewpoints of an excellent pattern profile and a high resolution.

The developing process according to Embodiment 1 can be employed to a positive-type radiation resist which is, for example, applied to a substrate, dried and exposed to radiation (exposure). It is possible to apply a developing process such as a dipping development in which a substrate coated with a resist is dipped to a developer for a pre-determined period of time followed by rinsing and drying; a puddle development in which a developer is mounded on the surface of the resist film on the substrate with a surface tension and the resultant was left for a pre-determined period of time, rinsed and dried; or a spray development in which a developer is sprayed to the surface of the resist film on the substrate followed by rinsing and drying.

An ultraviolet exposure equipment (an exposure equipment whose light source is aligner, stepper of excimer laser), electron beam writing systems and an X-ray exposure equipment can be used for radiation exposure (exposure) to a positive-type radiation resist.

A development can be performed, for example, at 10° C. to 30° C., preferably 13° C. to 28° C. A liquid capable of stopping the development and washing away the developer can be used as a rinse. solution, examples of which are methyl isobutylketone (hereinafter referred to as MIBK), isopropyl alcohol (hereinafter referred to as IPA) or a mixed solution thereof.

In Embodiment 1, a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms is used for developing a positive-type radiation resist containing a copolymer of an α-methyl styrene compound and an α-chloroacrylate ester compound as a base resin. According to this, an excellent pattern can be prepared because the dissolution rate (solubility in response to a different exposure dose) of a resist changes remarkably, the solubility being highly contrastive between an exposure area and an non-exposure area, and also because the solubility is low and a resist thickness decrease is small at the non- and low exposed area during a development.

Embodiment 2

(Patter-forming process A)

The second embodiment of the present invention (Embodiment 2) relates to a process for forming a pattern using a positive-type radiation resist containing a copolymer of an α-methyl styrene compound and an α-chloroacrylate ester compound as a base resin, wherein a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms is used.

As a ketone having 3 to 8 carbon atoms, a ketone having 4 to 6 carbon atoms is preferable. Examples thereof are acetone, methyl ethyl ketone, 2-pentanone, 3-methyl-2-butanone, 2-hexanone, MIBK, 2-heptanone, diethylketone, 3-hexanone, 3-heptanone, 4-heptanone, cyclohexanone and the like.

As a carboxylate ester having 3 to 8 carbon atoms, which ay have an alkoxyl group, a carboxylate ester having 3 to 6 carbon atoms with no alkoxyl group and a carboxylate ester having 5 to 7 carbon atoms with an alkoxyl group are preferable. Examples thereof are methyl acetate, ethyl acetate, n-propyl acetate, butyl acetate, isoamyl acetate, methyl propionate, ethyl propionate, methyl butyrate, ethyl butyrate, EEP, PGMEA, MMP, propyleneglycol monoethylether acetate and the like.

As a dicarboxylate ester having 3 to 8 carbon atoms, a dicarboxylate ester having 4 to 8 carbon atoms is preferable. Examples thereof are diethyl oxalate, dimethyl malonate, diethyl malonate, dimethyl succinate, diethyl succinate and the like.

When a mass production is considered, it is effective to use a developer consisting essentially of one organic solvent selected from the group consisting of PGMEA, 2-pentanone and EEP. from the viewpoints of solubility characteristics, a sensitivity, the price of the solvent and the like.

A surfactant or other elements, for example, can be added to a developer provided they are in a small amount. The addition brings about an effect of an improvement in a development.

Embodiment 2 refers to, in other words, a process for forming a pattern using a positive-type radiation resist containing a copolymer of an α-methyl styrene compound and an α-chloroacrylate ester compound as a base resin, wherein the development process of Embodiment 1 is used for developing the resist, and wherein a developer consisting essentially of one organic solvent selected from the group consisting of a ketone having 3 to 8 carbon atoms, a carboxylate ester having 3 to 8 carbon atoms, which may have an alkoxyl group, and a dicarboxylate ester having 3 to 8 carbon atoms, preferably from the group consisting of PGMEA, 2-pentanone and EEP.

The same positive-type radiation resist as used in Embodiment 1 is employed in this embodiment.

Embodiment 2 describes a process for forming a pattern using a positive-type radiation resist containing a copolymer of an α-methyl styrene compound and an α-chloroacrylate ester compound as a base resin, wherein a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms is used for developing the exposed positive-type radiation resist. Accordingly, an excellent pattern can be prepared.

By using a developer consisting essentially of one organic solvent selected from the group consisting essentially of a ketone having 3 to 8 carbon atoms, a carboxylate ester having 3 to 8 carbon atoms, which may have an alkoxy group, and a dicarboxylate ester having 3 to 8 carbon atoms, an excellent pattern can be prepared because the dissolution rate (the solubility in response to different exposure dose) of the resist changes remarkably, the solubility being highly contrastive between an exposure area and a non-exposure area. An excellent pattern can also be prepared because the solubility is particularly low and a resist thickness decrease is small at the non- and low exposed area during a development.

According to the pattern-forming process A, a micro-pattern can be prepared through a process for forming a pattern such that a resist is applied to a substrate and pre-baked, the solvent contained in the resist being evaporated to form a resist film, and then an exposure, a development and a patterning are performed followed by rinsing and drying.

Embodiment 3

(Pattern-forming process B)

The third embodiment of the present invention (Embodiment 3) relates to a process for forming a pattern according to GHOST method using a positive-type radiation resist containing a copolymer of an α-methyl styrene compound and an α-chloroacrylate ester compound as a base resin, wherein a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms is used.

As a ketone having 3 to 8 carbon atoms, a ketone having 4 to 6 carbon atoms is preferable. Examples thereof are acetone, methyl ethyl ketone, 2-pentanone, 3-methyl-2-butanone, 2-hexanone, MIBK, 2-heptanone, diethylketone, 3-hexanone, 3-heptanone, 4-heptanone, cyclohexanone and the like.

As a carboxylate ester having 3 to 8 carbon atoms, which may have an alkoxyl group, a carboxylate ester having 3 to 6 carbon atoms with no alkoxyl group and a carboxylate ester having 5 to 7 carbon atoms with an alkoxyl group are preferable. Examples thereof are methyl acetate, ethyl acetate, n-propyl acetate, butyl acetate, isoamyl acetate, methyl propionate, ethyl propionate, methyl butyrate, ethyl butyrate, EEP, PGMEA, MMP, propyleneglycol monoethylether acetate and the like.

As a dicarboxylate ester having 3 to 8 carbon atoms, a dicarboxylate ester having 4 to 8 carbon atoms is preferable. Examples thereof are diethyl oxalate, dimethyl malonate, diethyl malonate, dimethyl succinate, diethyl succinate and the like.

When a mass production is considered, it is effective to use a developer consisting essentially of one organic solvent selected from the group consisting of PGMEA, 2-pentanone and EEP from the viewpoints of solubility characteristics, a sensitivity, the price of the solvent and the like.

A surfactant or other elements, for example, can be added to a developer provided they are in a small amount. The addition brings about an effect of an improvement in a development.

Embodiment 3 refers to, in other words, a process for forming a pattern according to GHOST method using a positive-type radiation resist containing a copolymer of an α-methyl styrene compound and an α-chloroacrylate ester compound as a base resin, wherein the development process of Embodiment 1 is used for developing the resist, and wherein a developer consisting essentially of one organic solvent selected from the group consisting of a ketone having 3 to 8 carbon atoms, a carboxylate ester having 3 to 8 carbon atoms, which may have an alkoxyl group, and a dicarboxylate ester having 3 to 8 carbon atoms, preferably from the group consisting of PGMEA, 2-pentanone and EEP.

The same positive-type radiation resist as used in Embodiment 1 is employed in this embodiment.

GHOST method refers to a method of correcting proximity effect due to back dispersion by performing a feeble exposure using a beam whose diameter is shaded off to about that of the back dispersion to form a pattern reversal to the originally exposed pattern (proximity correction, p.208, "Innovation to LSI Lithography Technology" published by Science Forum K. K., Nov. 10, 1994). The problem with GHOST method has been a fear that the cross sectional view of a resist pattern profile is deformed while a process margin is decreased. This is because contrast of an energy accumulation between an exposed area and a non-exposed area is extremely reduced since an exposure is performed to the otherwise non-exposed area with an intensity 30 to 50% of that of an exposed area.

Embodiment 3 describes a process for forming a pattern according to GHOST method using a positive-type radiation resist containing a copolymer of an α-methyl styrene compound and an α-chloroacrylate ester compound as a base resin, wherein a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms is used for developing an exposed positive-type radiation resist. Accordingly, an excellent pattern can be prepared.

By using an developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms, an excellent pattern can be prepared because the dissolution rate (the solubility in response to a different exposure dose) of the resist changes remarkably, the solubility being highly contrastive between an exposure area and a non-exposure area. An excellent pattern can also be prepared because the solubility is particularly low and a resist thickness decrease is small at a non- and low exposed area during a development. In other words, deformation of the cross sectional view of the pattern profile and a decrease in a process margin can be prevented even if a non-exposure area is exposed by exposure dose 30 to 50% of that of the exposed area as in GHOST method.

In the pattern-forming process B, a micro-pattern can be prepared according to a process for forming a pattern such that a resist is applied to a substrate and pre-baked, the solvent contained in the resist being evaporated to form a resist film, and then an exposure, a development and a patterning are performed followed by rinsing and drying.

Embodiment 4

(Process for preparing a photomask)

The fourth embodiment of the present invention (Embodiment 4) relates to a process for preparing a photomask used for forming a pattern using a positive-type radiation resist containing a copolymer of an α-methyl styrene compound and an α-chloroacrylate ester compound as a base resin, wherein the pattern-forming processes according to Embodiments, 2 and 3, namely, the development process of Embodiment 1 is used, and wherein a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms is used.

As a ketone having 3 to 8 carbon atoms, a ketone having 4 to 6 carbon atoms is preferable. Examples thereof are acetone, methyl ethyl ketone, 2-pentanone, 3-methyl-2-butanone, 2-hexanone, MIBK, 2-heptanone, diethylketone, 3-hexanone, 3-heptanone, 4-heptanone, cyclohexanone and the like.

As the carboxylate ester having 3 to 8 carbon atoms, which may have an alkoxyl group, a carboxylate ester having 3 to 6 carbon atoms with no alkoxyl group and a carboxylate ester having 5 to 7 carbon atoms with an alkoxyl group are preferable. Examples thereof are methyl acetate, ethyl acetate, n-propyl acetate, butyl acetate, isoamyl acetate, methyl propionate, ethyl propionate, methyl butyrate, ethyl butyrate, EEP, PGMEA, MMP, propyleneglycol monoethylether acetate and the like.

As the dicarboxylate ester having 3 to 8 carbon atoms, a dicarboxylate ester having 4 to 8 carbon atoms is preferable. Examples thereof are diethyl oxalate, dimethyl malonate, diethyl malonate, dimethyl succinate, diethyl succinate and the like.

When a mass production is considered, it is effective to use a developer consisting essentially of one organic solvent selected from the group consisting of PGMEA, 2-pentanone and EEP from the viewpoints of solubility characteristics, a sensitivity, the price of the solvent and the like.

A surfactant or other elements, for example, can be added to a developer provided they are in a small amount. The addition brings about an effect of an improvement in a development.

The same positive-type radiation resist as used in Embodiment 1, 2 or 3 is employed in this embodiment.

In a general process for preparing a photomask, writing is performed by an electron beam on a mask blanks, i.e. a quartz substrate with a resist, and then a development is performed. As a developing process, it is possible to apply a dipping development in which a substrate coated with a resist is dipped to a developer for a pre-determined period of time followed by rinsing and drying; a puddle development in which a developer is mounded on the substrate with surface tension and then the resultant was left for a pre-determined period of time, rinsed and dried; a spray development in which a developer is sprayed to the surface of a resist film on a substrate followed by rinsing and drying; and other development processes.

As a base resin for a positive-type radiation resist, it is desirable to use a copolymer of an α-methyl styrene compound and an α-chloroacrylate ester compound having a relatively high molecular weight, for example, an weight average molecular weight of 10,000 to 1,000,000, preferably 50,000 to 400,000, more preferably 300,000 to 340,000. This brings about an effect on critical dimension (CD) uniformity and an improvement of a pattern profile. Herein, the weight average molecular weight refers to a value calculated as polystyrene according to a gel permeation chromatography in which tetrahydrofuran is used as an eluent.

A pattern is formed and an under layer usually comprising Cr is dry-etched by chloric or oxygen gas to prepare a mask pattern. After that the resist on the under layer is removed to prepare a photomask. The prepared photomask may be washed.

Embodiment 5

(Process for preparing a semiconductor device)

The fifth embodiment (Embodiment 5) relates to a process for preparing a semiconductor device, comprising a step for applying a resist film on a semiconductor substrate, a step for exposing and patterning the resist and a step for developing the resist after the exposure, wherein the developing process of Embodiment 1 is used for the step for developing the resist, and wherein a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms is used.

As a ketone having 3 to 8 carbon atoms, a ketone having 4 to 6 carbon atoms is preferable. Examples thereof are acetone, methyl ethyl ketone, 2-pentanone, 3-methyl-2-butanone, 2-hexanone, MIBK, 2-heptanone, diethylketone, 3-hexanone, 3-heptanone, 4-heptanone, cyclohexanone and the like.

As a carboxylate ester having 3 to 8 carbon atoms, which may have an alkoxyl group, a carboxylate ester having 3 to 6 carbon atoms with no alkoxyl group and a carboxylate ester having 5 to 7 carbon atoms with an alkoxyl group are preferable. Examples thereof are methyl acetate, ethyl acetate, n-propyl acetate, butyl acetate, isoamyl acetate, methyl propionate, ethyl propionate, methyl butyrate, ethyl butyrate, EEP, PGMEA, MMP, propyleneglycol monoethylether acetate and the like.

As a dicarboxylate ester having 3 to 8 carbon atoms, a dicarboxylate ester having 4 to 8 carbon atoms is preferable. Examples thereof are diethyl oxalate, dimethyl malonate, diethyl malonate, dimethyl succinate, diethyl succinate and the like.

When a mass production is considered, it is effective to use a developer consisting essentially of one organic solvent selected from the group consisting of PGMEA, 2-pentanone and EEP from the viewpoints of solubility characteristics, a sensitivity, the price of the solvent and the like.

A surfactant or other elements, for example, can be added to a developer provided they are in a small amount. The addition brings about an effect of an improvement in a development.

Since a developer consisting essentially of one organic solvent is used, the developer evaporates uniformly from the surface and a critical dimension (CD) uniformity of a pattern size is improved. Therefore, the pattern size of the semiconductor substrate also becomes uniform at an etching step in a process of preparing a semiconductor device.

The same positive-type radiation resist as used in Embodiment 1, 2 or 3 is employed in this embodiment.

In a general process for preparing a semiconductor, a resist is applied to a semiconductor substrate and pre-baked, the solvent contained in the resist being evaporated to form a resist film, and then being exposed with a short wavelength laser, an electron beam or an X-ray, the resist film is developed and patterned followed by rinsing and drying to form a pattern. Etching by using an obtained resist pattern as a mask makes a micro-processing possible.

During a pattern-forming exposure on a semiconductor substrate, no mask is used when an electron beam is used. However, it is possible to adopt a short wavelength laser exposure using a photomask, an X-ray exposure using any other mask such as an X-ray mask or an electron beam writing using an electron beam mask. Also, referring to a photomask, a photomask of Embodiment 4 can be used in this embodiment.

As a base resin for a positive-type radiation resist, it is desirable to use a copolymer of an α-methylstyrene compound and an α-chloroacrylate ester compound having an weight average molecular weight of 10,000 to 1,000,000, preferably 50,000 to 400,000, more preferably 300,000 to 340,000. This brings about an effect on an improvement of a pattern profile due to a developing process. Herein, the weight average molecular weight refers to a value calculated as polystyrene according to a gel permeation chromatography in which tetrahydrofuran is used as an eluent.

According to the developing process of the first invention, since a developer consisting essentially of one organic solvent is used, the developer evaporates uniformly from the surface, the development proceeds at a flat rate and CD uniformity of a pattern size is improved. Therefore, CD uniformity is also improved, for example, at an etching step in a process of preparing a photomask.

According to the developing process of the first invention, since a dissolution rate (a solubility in response to different exposure dose) of the resist changes remarkably, the solubility becomes highly contrastive between an exposure area and a non-exposure area. Therefore, an excellent pattern can be prepared.

According to the developing process of the first invention, since solubility is particularly low and a resist thickness decrease is small at a non- and low exposed area during a development, an excellent pattern can also be prepared. Therefore, according to the present invention, an improvement can be found concerning an accuracy of a resist pattern size, i.e. CD uniformity and contrast of a resist pattern.

According to the developing process of the first invention, by using a developer consisting essentially of one organic solvent selected from the group consisting of a ketone having 3 to 8 carbon atoms, a carboxylate ester having 3 to 8 carbon atoms, which may have an alkoxy group, and a dicarboxylate ester having 3 to 8 carbon atoms, an excellent pattern can be prepared because a dissolution rate (a solubility in response to a different exposure dose) of the resist changes remarkably and the solubility becomes highly contrastive between an exposure area and a non-exposure area.

According to the developing process of the first invention, since solubility is particularly low and a resist thickness decrease is small at the non- and low exposed area during a development, an excellent pattern can also be prepared. Also, since one organic solvent is used singly for a development, the critical dimension (CD) uniformity is improved and an effect on an etching uniformity is thereby found.

According to the pattern-forming process of the second invention, in the pattern-forming (according to GHOST method, for example) a deformation of the cross sectional view of a pattern profile and a decrease in a process margin can be prevented even if a non-exposure area is exposed by exposure dose 30 to 50% of that of the exposed area since the resist has a highly contrastive solubility.

According to the pattern-forming process of the second invention, the same effect as the above can be found in a process for preparing a photomask.

According to the process for preparing a semiconductor device of the third invention, the same effect as the above can be found in a process for preparing a semiconductor device.

EXAMPLES

Comparative Example 1

By using EB writing systems, writing was performed on a mask blanks to which a resist for preparing a photomask, trade name ZEP-7000 available from Nippon Zeon Co. Ltd., containing a copolymer of α-methylstyrene and methyl α-chloroacrylate as a base resin is applied. A puddle development was performed with a developer, trade name ZED-500 available from Nippon Zeon Co. Ltd., comprising 50% of diethylketone and 50% of diethyl malonate under a condition of 23° C. for 200 sec. After that it was rinsed with MIBK for 1 min and dried. With the obtained resist pattern as a mask, the under layer of Cr was dry-etched by chloric or oxygen gas, followed by removing of the resist and washing to prepare a photomask.

After the development, the resist thickness of the non-exposed area was measured according to a resist thickness meter made by Nanometrix Japan Co., Ltd. Accordingly, the resist thickness was found to be decreased by 15% based on the initial resist thickness. As to the pattern profile, AFM (Atomic Force Microscopy), trade name Nano Scope III made by Digital Instruments, was used to observe the cross sectional view. The critical dimension (CD) uniformity was measured according to a SEM and it was revealed that CD uniformity was 30 nm on the basis of range value (maximum−minimum) in case of measurements at 13 points within the surface.

Example 1

By using EB writing systems, writing was performed on a mask blanks to which a resist for preparing a photomask, trade name ZEP-7000 available from Nippon Zeon Co. Ltd., was applied. A puddle development was performed with a developer of 2-pentanone under a condition of 23° C. for 200 sec. After that it was rinsed with MIBK for 1 min and dried. With the obtained resist pattern as a mask, the under layer of Cr was dry-etched by chloric or oxygen gas, followed by removing of the resist and washing to prepare a photomask. As to the resist pattern, a highly contrastive pattern profile was obtained with a small resist thickness decrease at the non-exposed area compared to the resist pattern of Comparative Example 1. Also, the critical dimension (CD) uniformity was increased by 17%.

Example 2

By using EB writing systems, writing was performed on a mask blanks to which a resist for preparing a photomask, trade name ZEP-7000 available from Nippon Zeon Co. Ltd., was applied. A puddle development was performed with a developer of PGMEA under a condition of 23° C. for 400 sec. After that it was rinsed with MIBK for 1 min and dried. With the obtained resist pattern as a mask, the under layer of Cr was dry-etched by chloric or oxygen gas, followed by removing of the resist and washing to prepare a photomask. As to the resist pattern, a highly contrastive pattern profile was obtained with a small resist thickness decrease at the non-exposed area compared to the resist pattern of Comparative Example 1. Also, the critical dimension (CD) uniformity was increased by 15%.

Example 3

By using EB writing systems, writing was performed on a mask blanks to which a resist for preparing a photomask, trade name ZEP-7000 available from Nippon Zeon Co. Ltd., is applied. A puddle development was performed with a developer of EEP under a condition of 23° C. for 500 sec. After that it was rinsed with MIBK for 1 min and dried. With the obtained resist pattern as a mask, the under layer of Cr was dry-etched by chloric or oxygen gas, followed by removing of the resist and washing to prepare a photomask. As to the resist pattern, a highly contrastive pattern profile was obtained with a small resist thickness decrease at the non-exposed area compared to the resist pattern of Comparative Example 1. Also, the critical dimension (CD) uniformity was increased by 15%.

Comparative Example 2

Writing was performed on a mask blanks to which a resist for preparing a photomask, trade name. ZEP-7000 available from Nippon Zeon Co. Ltd., was applied according to GHOST method by using EB writing systems, i.e. electron-beam writing systems having accelerating voltage of 10 keV. A puddle development was performed with a developer, trade name ZED-500 available from Nippon Zeon Co. Ltd., comprising 50% of diethylketone and 50% of diethyl malonate under a condition of 23° C. for 150 sec. After that it was rinsed with MIBK for 1 mm and dried. With the obtained resist pattern as a mask, the under layer of Cr was dry-etched by chloric or oxygen gas, followed by removing of the resist and washing to prepare a photomask.

As to the resist pattern, the resist thickness was reduced by 20% based on the initial resist thickness. The critical dimension (CD) uniformity was 50 nm on the basis of the range value.

Example 4

Writing was performed on a mask blanks to which a resist for preparing a photomask, trade name ZEP-7000 available from Nippon Zeon Co. Ltd., was applied according to GHOST method by using EB writing systems, i.e. electron-beam writing systems having accelerating voltage of 10 keV. A puddle development was performed with a developer of PGMEA under a developing condition of 23° C. for 300 sec. After that it was rinsed with MIBK for 1 min and dried. With the obtained resist pattern as a mask, the under layer of Cr was dry-etched by chloric or oxygen gas, followed by removing of the resist and washing to prepare a photomask. As to the resist pattern, a highly contrastive pattern profile was obtained with a small resist thickness decrease at the non-exposed area compared to the resist pattern of Comparative Example 2. Also, the critical dimension (CD) uniformity was increased by 30%.

Comparative Example 3

According to EB writing systems, writing was performed on a silicon wafer to which a positive-type radiation resist, trade name ZEP-7000 available from Nippon Zeon Co. Ltd., containing a copolymer of α-methylstyrene and methyl α-chloroacrylate as a base resin was spin-coated. The resist thickness of the resist was 0.2 μm. A dipping development was performed with a developer, trade name ZED-500 available from Nippon Zeon Co. Ltd., comprising 50% of diethylketone and 50% of diethyl malonate under a condition of 23° C. for 60 sec. After that it was rinsed with MIBK for 10 sec and dried to obtain a resist pattern. With the obtained resist pattern as a mask, a pattern was formed on a silicon oxide film by the following processing of etching to prepare a semiconductor device.

Example 5

A positive-type radiation resist, trade name ZEP-7000 available from Nippon Zeon Co. Ltd., containing a copolymer of α-methylstyrene and methyl α-chloroacrylate as a base resin was applied to a silicon wafer and baked at 180° C. for 180 sec to obtain a film having a thickness of 0.2 μm. Then writing was performed according to EB writing systems. A dipping development was performed with a developer of PGMEA under a developing condition of 23° C. for 120 sec. After that it was rinsed with MIBK for 10 sec and dried. The obtained resist pattern was highly contrastive with a small resist thickness decrease at the non-exposed area. With the obtained resist pattern as a mask, a pattern was formed on a silicon oxide film by the following processing of etching to prepare a semiconductor device.

Example 6

A positive-type radiation resist, trade name ZEP-7000 available from Nippon Zeon Co. Ltd., containing a copolymer of α-methylstyrene and methyl α-chloroacrylate as a base resin was applied to a silicon wafer and baked at 180° C. for 180 sec to obtain a film having a thickness of 0.2 μm. Then writing was performed according to EB writing systems. A puddle development was performed with a developer of 2-pentanone under a condition of 23° C. for 60 sec. After that it was rinsed with MIBK for 10 sec and dried. The obtained resist pattern was highly contrastive with a small resist thickness decrease at the non-exposed area. With the obtained resist pattern as a mask, a pattern was formed on a silicon oxide film by the following processing of etching to prepare a semiconductor device.

Example 7

A positive-type radiation resist, trade name ZEP-7000 available from Nippon Zeon Co. Ltd., containing a copolymer of α-methylstyrene and methyl α-chloroacrylate as a base resin was applied to a silicon wafer and baked at 180° C. for 180 sec to obtain a film having a thickness of 0.2 μm. Then writing was performed according to EB writing systems. A puddle development was performed with a developer of EEP under a developing condition of 23° C. for 150 sec. After that it was rinsed with MIBK for 10 sec and dried. The obtained resist pattern was highly contrastive with a small resist thickness decrease at the non-exposed area. With the obtained resist pattern as a mask, a pattern was formed on a silicon oxide film by the following processing of etching to prepare a semiconductor device.

Example 8

A positive-type radiation resist, trade name ZEP-7000 available from Nippon Zeon Co. Ltd., containing a copolymer of α-methylstyrene and methyl α-chloroacrylate as a base resin was applied to a silicon wafer and baked at 180° C. for 180 sec to obtain a film having a thickness of 0.2 μm. Then writing was performed by using an X-ray mask according to an X-ray exposure equipment. A dipping development was performed with a developer of PGMEA under a condition of 23° C. for 120 sec. After that it was rinsed with MIBK for 10 sec and dried. The obtained resist pattern was highly contrastive with a small resist thickness decrease at the non-exposed area. With the obtained resist pattern as a mask, a pattern was formed on a silicon oxide film by the following processing of etching to prepare a semiconductor device.

Example 9

A positive-type radiation resist, trade name ZEP-7000 available from Nippon Zeon Co. Ltd., containing a copolymer of α-methylstyrene and methyl α-chloroacrylate as a base resin was applied to a silicon wafer and baked at 180° C. for 180 sec to obtain a film having a thickness of 0.2 μm. Then writing was performed by using a photomask according to a KrF excimer laser irradiation equipment. A dipping development was performed with a developer of PGMEA under a condition of 23° C. for 120 sec. After that it was rinsed with MIBK for 10 sec and dried. The obtained resist pattern was highly contrastive with a small resist thickness decrease at the non-exposed area. With the obtained resist pattern as a mask, a pattern was formed on a silicon oxide film by the following processing of etching to prepare a semiconductor device.

What is claimed is:

1. A developing process comprising using a developer consisting essentially of one organic solvent selected from the group consisting of a carboxylate ester having 3 to 8 carbon atoms, which may have an alkoxy group, and a dicarboxylate ester having 3 to 8 carbon atoms for developing a radiation-sensitive positive resist containing a copolymer of an α-methyl styrene compound and an α-chloroacrylate ester compound as a base resin.

2. A developing process according to claim 1, wherein the developer consists essentially of one organic solvent selected from the group consisting of propyleneglycol monomethylether acetate, 2-pentanone and ethyl-3-ethoxypropionate.

3. A developing process according to claim 1, wherein the developer is a carboxylate ester having 3 to 8 carbon atoms, which may have an alkoxy group.

4. A developing process according to claim 1, wherein the developer is a dicarboxylate ester having 3 to 8 carbon atoms.

5. A developing process according to claim 1, wherein the developer is propyleneglycol monomethylether acetate.

6. A developing process according to claim 1, wherein the developer is ethyl-3-ethoxypropionate.

7. A process for forming a pattern using a radiation-sensitive positive resist containing a copolymer of an α-methyl styrene compound and an α-chloroacrylate ester compound as a base resin, wherein a developer consisting essentially of one organic solvent selected from the group consisting of a carboxylate ester having 3 to 8 carbon atoms, which may have an alkoxyl group, and a dicarboxylate ester having 3 to 8 carbon atoms is used.

8. A process for forming a pattern according to claim 7, wherein the developer consists essentially of one organic solvent selected from the group consisting of propyleneglycol monomethylether acetate, 2-pentanone and ethyl-3-ethoxypropionate.

9. A process for forming a pattern according to claim 8, wherein the pattern is formed according to GHOST method.

10. A process for forming a pattern according to claim 8, wherein a pattern of a photomask is formed.

11. A process for forming a pattern according to claim 7, wherein the pattern is formed according to GHOST method.

12. A process for forming a pattern according to claim 7, wherein a pattern of a photomask is formed.

13. A process for preparing a semiconductor device comprising forming a resist film on a semiconductor substrate, exposing the resist to be patterned, and developing the resist after the exposure, wherein the resist is a radiation-sensitive positive resist containing a copolymer of an α-methyl styrene compound and an α-chloroacrylate ester compound as a base resin, and wherein a developer consisting essentially of one organic solvent selected from the group consisting of a carboxylate ester having 3 to 8 carbon atoms, which may have an alkoxyl group, and a dicarboxylate ester having 3 to 8 carbon atoms is used.

14. A process for preparing a semiconductor device according to claim 13, wherein the developer consists essentially of one organic solvent selected from the group consisting of propyleneglycol monomethylether acetate, 2-pentanone and ethyl-3-ethoxypropionate.

* * * * *

UNITED STATES PATENT AND TRADEMARK OFFICE

CERTIFICATE OF CORRECTION

PATENT NO. : 6,511,792 B2
DATED : January 28, 2003
INVENTOR(S) : Atsuko Fujino et al.

It is certified that error appears in the above-identified patent and that said Letters Patent is hereby corrected as shown below:

Column 14,
Lines 2, 25 and 52, "acetate, 2-pentanone and " should read -- acetate and --.

Signed and Sealed this

Second Day of September, 2003

JAMES E. ROGAN
*Director of the United States Patent and Trademark Office*